(12) United States Patent
Shapiro

(10) Patent No.: US 10,359,325 B2
(45) Date of Patent: Jul. 23, 2019

(54) THIN FILM STRAIN GAUGE

(71) Applicant: Strain Measurement Devices, Inc., Wallingford, CT (US)

(72) Inventor: Daniel E. Shapiro, Branford, CT (US)

(73) Assignee: STRAIN MEASUREMENT DEVICES, INC., Wallingford, CT (US)

(*) Notice: Subject to any disclaimer, the term of this patent is extended or adjusted under 35 U.S.C. 154(b) by 131 days.

(21) Appl. No.: 15/595,040

(22) Filed: May 15, 2017

(65) Prior Publication Data
US 2018/0328801 A1    Nov. 15, 2018

(51) Int. Cl.
*G01L 1/22* (2006.01)
*H01C 10/10* (2006.01)
*H01L 23/10* (2006.01)

(52) U.S. Cl.
CPC ............ *G01L 1/2287* (2013.01); *G01L 1/225* (2013.01); *G01L 1/2206* (2013.01); *H01C 10/10* (2013.01); *H01L 23/10* (2013.01)

(58) Field of Classification Search
None
See application file for complete search history.

(56) References Cited

U.S. PATENT DOCUMENTS 7,632,537 B2 * 12/2009 Berryman ............ H01C 7/003
427/101

* cited by examiner

*Primary Examiner* — Jamel E Williams
(74) *Attorney, Agent, or Firm* — Cantor Colburn LLP

(57) ABSTRACT

A strain gauge includes: a substrate; a dielectric layer on the substrate; a thin film electrical circuit on the dielectric layer and having input/output terminals; other layers disposed on the electrical circuit; the dielectric layer forming a first seal on one side of the electrical circuit, the other layers forming a second seal on a second side of the electrical circuit, the first and second seals having structure such that: in a first instance prior to exposure of the strain gauge to an autoclave cycle, the electrical circuit is productive of a first output voltage in response to a first input voltage; and in a second instance subsequent to exposure of the strain gauge to at least 25 autoclave cycles, the electrical circuit is productive of a second output voltage in response to a second input voltage, the first and second input voltages being equal, and the first and second output voltages being equal.

23 Claims, 4 Drawing Sheets

THIN FILM STRAIN GAUGE

BACKGROUND OF THE INVENTION

The present disclosure relates generally to a strain gauge, particularly to a thin film strain gauge, and more particularly to an autoclavable thin film strain gauge.

Thin film strain gauges employing precision resistors in a Wheatstone bridge electrical circuit arrangement are known in the art.

Applicant has been using thin film vacuum deposition process to bond strain gauges directly to 15-5 stainless steel, Inconel, sapphire, and titanium for a number of years. A typical process begins by preparing the surface of the substrate with an abrasive slurry to remove all surface imperfections. The next step is the deposition of an oxide layer to insulate the circuit from the metal substrate. Following this, a thin film resistive alloy is sputtered over the oxide layer. This latter film is laser trimmed under power to produce the four resistors of the Wheatstone bridge. Solder pads are applied and wired to the circuit to provide a power egress and the whole thing is coated with an encapsulation to protect the thin film.

Over time, the thin film strain gauge has proven itself to be the preferred means for measuring strain in critical applications where small size, robust performance, long term stability and superior accuracy are required. An application of the thin film sensor technology is in the field of medical pump technology. When delivery of fluids to the body via infusion pumps, insulin pumps, enteral feed pumps, and wound irrigation systems is interrupted by a pinched tube or pump, undesired consequences may result. Often, 'tube sensors' are used to monitor pressure in these pump systems by measuring the force exerted onto a sensor pressed against the expanding walls of a polyurethane or PVC tubing or they place the sensor behind the pump to record pressures as the pump backs up against the sensor during operation. Thin film sensors have the repeatability and the ability to survive the rough handling and accuracy required to be successful in these pump applications.

However, such pump applications do not involve the surgical sterilization of a surgical device having a thin film strain gauge that is an integral part of the surgical device.

As such, and while existing thin film sensors may be suitable for their intended purpose, the art of thin film strain gauges would be advanced with a thin film strain gauge having the structural integrity to withstand exposure to multiple autoclave surgical-instrument sterilizing cycles and multiple surgical-instrument cleaning detergent cycles without statistically significant loss in accuracy.

This background information is provided to reveal information believed by the applicant to be of possible relevance to the present invention. No admission is necessarily intended, nor should be construed, that any of the preceding information constitutes prior art against the present invention.

BRIEF DESCRIPTION OF THE INVENTION

An embodiment includes an open-face strain gauge, having: a substrate; at least one dielectric layer disposed on top of the substrate; a thin film electrical circuit disposed on top of the at least one dielectric layer and having at least two input terminals and at least two output terminals; a plurality of layers disposed on top of the electrical circuit; the at least one dielectric layer forming a first moisture resistant seal on one side of the electrical circuit, the plurality of layers forming a second moisture resistant seal on a second side of the electrical circuit opposite the first side, the first and second moisture resistant seals having structure such that: in a first instance prior to exposure of the strain gauge to an autoclave cycle, the electrical circuit is productive of a first output voltage on the output terminals in response to a first input voltage on the input terminals; and in a second instance subsequent to exposure of the strain gauge to at least 25 autoclave cycles, the electrical circuit is productive of a second output voltage on the output terminals in response to a second input voltage on the input terminals, the second input voltage being equal to the first input voltage, and the second output voltage being equal to the first output voltage.

The above features and advantages and other features and advantages of the invention are readily apparent from the following detailed description of the invention when taken in connection with the accompanying drawings.

BRIEF DESCRIPTION OF THE DRAWINGS

Referring to the exemplary non-limiting drawings wherein like elements are numbered alike in the accompanying Figures.

DETAILED DESCRIPTION OF THE INVENTION

Although the following detailed description contains many specifics for the purposes of illustration, anyone of ordinary skill in the art will appreciate that many variations and alterations to the following details are within the scope of the invention. Accordingly, the following example embodiments of the invention are set forth without any loss of generality to, and without imposing limitations upon, the claimed invention.

An embodiment of the invention, as shown and described by the various figures and accompanying text, provides an open-face thin film strain gauge having the structural integrity to withstand exposure to multiple autoclave surgical-instrument sterilizing cycles and multiple surgical-instrument cleaning detergent cycles without statistically significant loss in accuracy. In an embodiment, the structural integrity is provided by an arrangement of layers (discussed further below) that provide a bonded moisture seal on both bottom and top surfaces of a strain sensitive layer, while having the flexibility to move with the strain sensitive layer, without disturbing the bonded moisture seals, during a strain measurement action.

As used herein, the term open-face thin film strain gauge in general means a strain gauge having a strain sensitive layer that is not protected from the surrounding environment by way of an hermetically sealed cap, which may be metal, ceramic, plastic, or any other suitable material, for example.

Other features associated with the term open-face thin film strain gauge will become apparent from the description that follows.

While example embodiments disclosed herein depict a strain gauge having a circular footprint, it will be appreciated that the disclosed invention is not so limited and encompasses other shapes of strain gauges, such as rectangular, octagonal, or otherwise non-circular, for example. Any and all shapes of strain gauges that fall within the ambit of the appended claims are considered to be within the scope of the invention disclosed herein.

Figure 1:
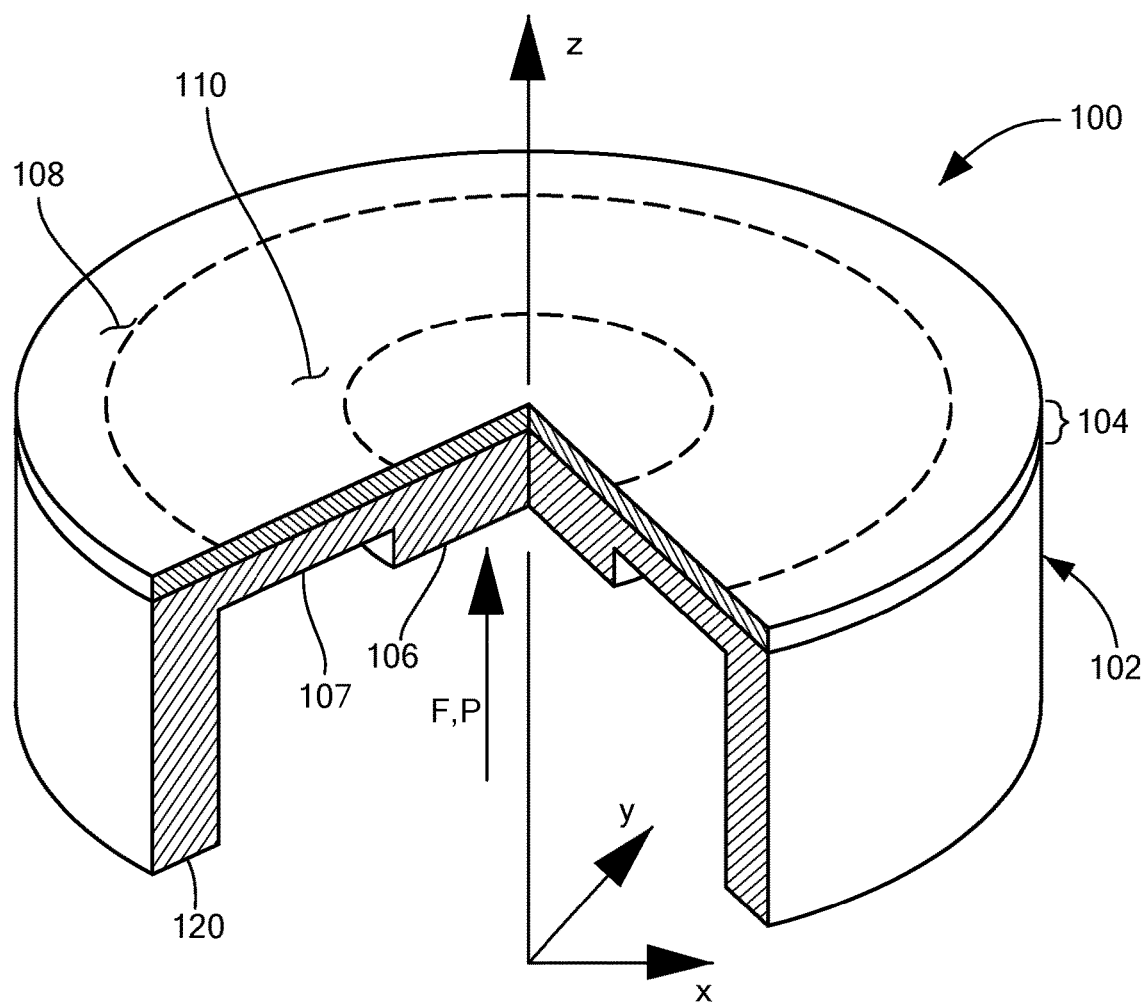
FIG. 1 depicts a generalized cutaway rotated isometric view of an example embodiment of a thin film strain gauge in accordance with an embodiment of the invention.

FIG. 1 depicts generally (some detail omitted for clarity but elaborated on in other figures) a cutaway rotated isometric view of an example embodiment of a thin film strain gauge 100 (also herein referred to simply as strain gauge) having a substrate 102 and a plurality of layers 104 disposed on top of the substrate 102. While the plurality of layers 104 are depicted in bulk in FIG. 1, they are depicted and described in more detail below with reference to other figures. As depicted in FIG. 1, an embodiment of the substrate 102 has an overall circular footprint having a central Z-axis, and an engagement surface 106 disposed at an underside region of the substrate 102.

In an embodiment, the substrate 102 comprises a flexible corrosion resistant metal such as titanium, ceramic, aluminum, stainless steel, precipitation-hardening stainless steel, or a superalloy, for example.

As used herein, any reference to top, bottom, upper, lower, underside, upperside, inside, outside, or any other orientational language, is not intended to be limiting in any way, but is merely used herein to orient certain features relative to other features, or axes, such as the orthogonal set of X-Y-Z axes depicted in FIG. 1.

The upperside 108 of the strain gauge 100 is in open-face relationship with ambient, that is, the upperside 108 is not protected from ambient by way of an hermetically sealed cap, which is a known method in the art for protecting the strain sensitive layer of a strain gauge. Such a known method, however, results in a physically larger strain gauge that may be undesirable or unusable in certain strain gauge applications.

On the upperside 108, and part of the composite of the plurality of layers 104 is an embedded strain sensitive layer in the form of a thin film electrical circuit comprising an electrically conductive strain sensor layer 300 (best seen with reference to FIGS. 2 and 3 and discussed in more detail below) having a plurality of electrically resistive thin film sensors 320 that form a Wheatstone bridge 322 (best seen with reference to FIGS. 2 and 2A and discussed in more detail below). The sensors 320 of the Wheatstone bridge 322 are disposed generally within the region 110 bounded by the dashed lines depicted in FIG. 1.

While an embodiment of the strain gauge 100 is disclosed herein having the strain sensor layer 300 disposed on the upperside 108 of the substrate 102, it will be appreciated that this is for illustration purposes only and is non-limiting, as the strain sensor layer 300 may alternatively be disposed on the underside 107 of the substrate 102. Stated alternatively, the strain sensor layer 300 may be disposed on a side of the substrate 102 that is directly subjected to a force F or pressure P, or may be disposed on an opposing side of the substrate 102 that is not directly subjected to the force F or pressure P.

Figure 2:
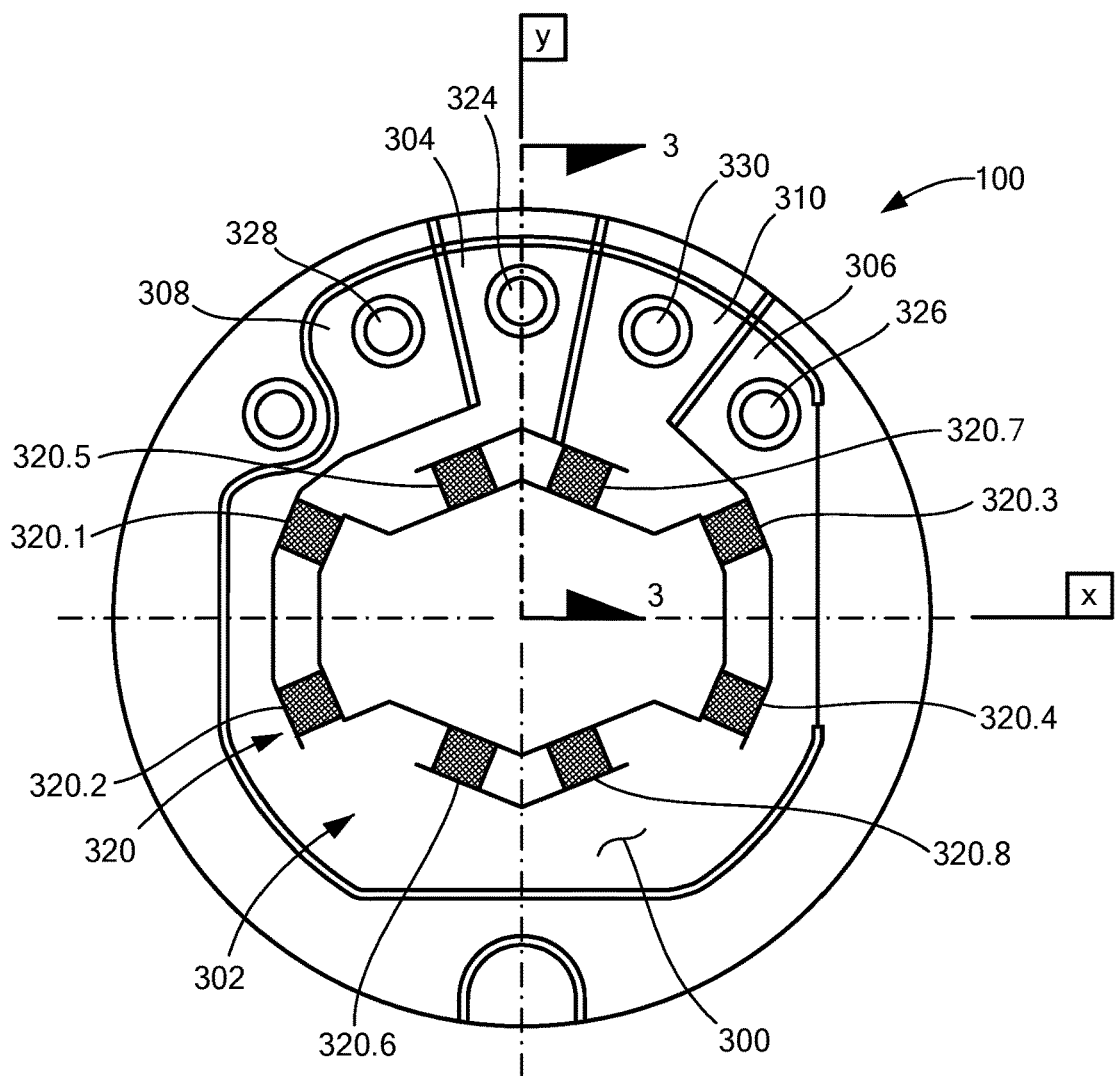
FIG. 2 depicts a top-down plan view of the strain gauge of FIG. 1 in accordance with an embodiment of the invention.

In an embodiment, the electrically conductive strain sensor layer 300 comprises a resistive alloy, and the electrically resistive thin film sensors 320 of the Wheatstone bridge 322 comprise electrical paths defined by etched or laser trimmed portions of the resistive alloy (best seen with reference to FIG. 2).

Figure 2A:
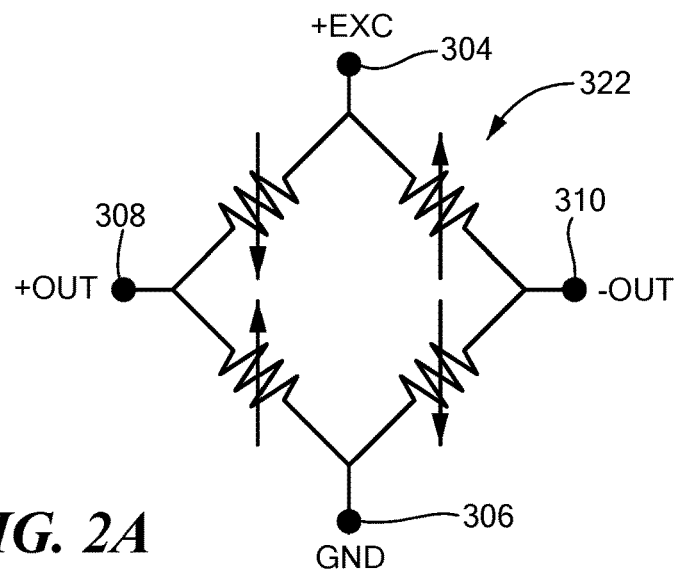
FIG. 2A depicts an example Wheatstone bridge in accordance with an embodiment of the invention.
Figure 3:
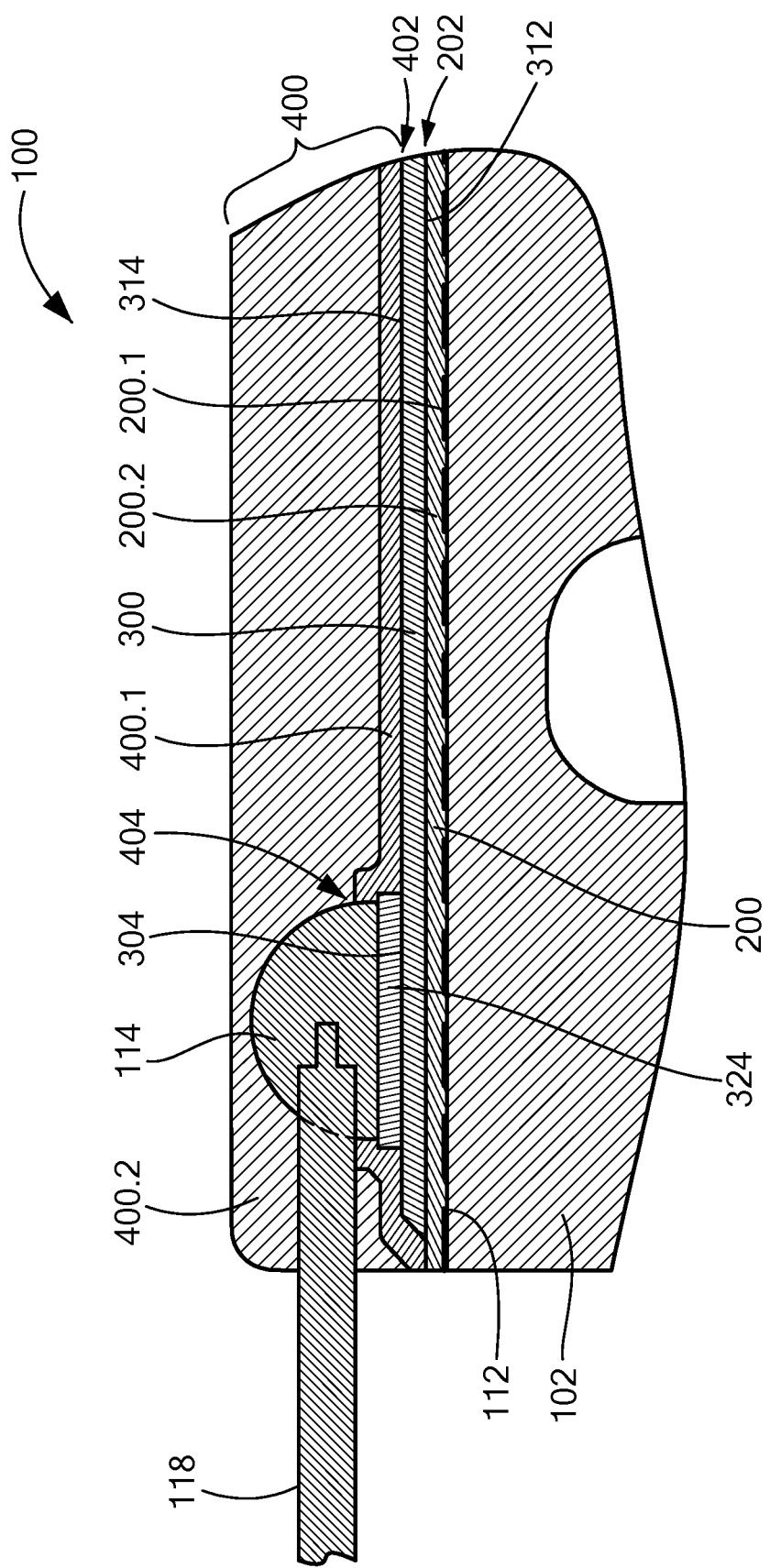
FIG. 3 depicts a section cut through Section 3-3 in FIG. 2 in accordance with an embodiment of the invention.

FIG. 2 depicts a top-down plan view of an example embodiment of the strain gauge 100 (with the electrically conductive strain sensor layer 300 depicted as though it were visible) having eight electrically resistive thin film sensors 320.1-320.8 (generally referred to in combination by reference numeral 320) electrically arranged to form the Wheatstone bridge 322 (see FIG. 2A), and FIG. 3 depicts a section cut through Section 3-3 in FIG. 2.

While an embodiment of the invention is described and illustrated herein having a certain number of sensors 320, eight for example, configured as a full Wheatstone bridge (full-bridge), it will be appreciated that this is for illustration purposes only and that the scope of the invention is not so limited and encompasses any number of sensors suitable for a purpose disclosed herein, such as two or four, for example, and may be configured as a full-bridge or a half-bridge having electrical circuitry known in the art and therefore not requiring further description or illustration herein. As such, reference hereinafter is simply to the "Bridge 322", which serves to encompass both a full-bridge and a half-bridge, or more particularly at least a partial Wheatstone bridge.

With reference now to FIG. 3 in combination with FIGS. 1, 2 and 2A, the strain gauge 100 further includes: at least one dielectric layer 200, which is part of the composite of the plurality of layers 104, disposed on top of the substrate 102; a strain sensor layer 300, which is part of the composite of the plurality of layers 104, having a thin film electrical circuit 302, in the configuration of the Bridge 322, disposed on top of the at least one dielectric layer 200 and having at least two input terminals 304, 306 and at least two output terminals 308, 310 (best seen with reference to FIGS. 2 and 2A); and, a plurality of layers 400, which is part of the composite of the plurality of layers 104, disposed on top of the electrical circuit 302.

In an embodiment, the plurality of layers 400 comprises two layers; a dielectric a-layer 400.1 disposed on top of the electrical circuit 302, and an encapsulant b-layer 400.2 disposed on top of the a-layer 400.1. In an embodiment, the a-layer 400.1 comprises an oxide, such as but not limited to glass for example, and the b-layer 400.2 comprises a curable organic encapsulant, such as but not limited to silicone for example.

In an embodiment, the at least one dielectric layer 200 comprises two layers; a c-layer 200.1 disposed on top of the substrate 102, and a d-layer 200.2 disposed on top of the c-layer 200.1. In an embodiment, the c-layer 200.1 comprises a native oxide derived from the substrate 102, such as but not limited to chrome oxide for example, and the d-layer 200.2 comprises an oxide, such as but not limited to glass for example.

From the foregoing, it will be appreciated that the thin film electrical circuit 302 of the Bridge 322 is disposed in an open-face relationship with an environment (i.e., ambient) external of the strain gauge 100, while at the same time being encapsulated by the at least one dielectric layer 200 and the plurality of layers 400.

The at least one dielectric layer 200 forms a first moisture resistant seal 202 on one side 312, the underside, of the electrical circuit 302, and the plurality of layers 400 forms a second moisture resistant seal 402 on a second side 314, the upperside, of the electrical circuit 302 opposite the first side 312.

In an embodiment, the at least one dielectric layer 200 is disposed in conforming intimate contact with an upper surface 112 of the substrate 102, and the plurality of layers 400 is disposed in conforming intimate contact with the upper surface (i.e., upperside) 314 of the electrical circuit 302. In an embodiment, the upper surface 112 of the substrate 102 is a polished surface upon which the at least one first dielectric layer 200 is disposed. As used herein, the phrase "in conforming intimate contact" means that the respective abutting materials have no or substantially no voids therebetween so as to provide a degree of moisture resistant seals suitable for a purpose disclosed herein.

For the strain gauge 100 to have the structural integrity to withstand exposure to multiple autoclave surgical-instrument sterilizing cycles and multiple surgical-instrument cleaning detergent cycles without statistically significant loss in accuracy, the first and second moisture resistant seals 202, 402 have sufficient structure such that: in a first instance prior to exposure of the strain gauge 100 to an autoclave cycle, the electrical circuit 302 is productive of a first output voltage on the output terminals 308, 310 in response to a first predefined input voltage on the input terminals 304, 306; and, in a second instance subsequent to exposure of the strain gauge 100 to at least 25 autoclave cycles, alternatively to at least 50 autoclave cycles, or further alternatively to at least 100 autoclave cycles, the electrical circuit 302 is productive of a second output voltage on the output terminals 308, 310 in response to a second predefined input voltage on the input terminals 304, 306, where the second input voltage is equal to the first input voltage within a defined acceptance range, and the second output voltage is equal to the first output voltage within a defined acceptance range. In an embodiment, the second output voltage being equal to the first output voltage is representative of the plurality of electrically resistive thin film sensors 320 of the Bridge 322 being free of strain and absent a corrosion-influenced electrical short circuit path that would otherwise be effective to cause the Bridge 322 to become unbalanced. In an embodiment, the equivalence of the second input voltage to the first input voltage, and the equivalence of the second output voltage to the first output voltage, may be established through experimentation and statistical analysis, where the term equivalence is understood to mean statistically equivalent, that is, any observed difference between two measured values is considered to be an acceptable difference for a purpose disclosed herein.

In an embodiment, each autoclave cycle is configured to expose the strain gauge 100 to saturated steam at a relative humidity of 100%, at a pressure of 2-35 psi (pounds per square inch), at a temperature of 100-140 degree-Celsius, for a length of time of 15-20 minutes. More specifically, each autoclave cycle is configured to expose the strain gauge 100 to saturated steam at a relative humidity of 100%, at a pressure of 16-30 psi, at a temperature of 121-138 degree-Celsius, for a length of time of 17-19 minutes. While certain lengths of times are described herein for an autoclave cycle, it will be appreciated that this is for illustration purposes only, as a particular sterilization process may require more or less time, where some processes may require a lesser length of time of 90-180 seconds, for example, or may require a length of time greater than 20 minutes, for example.

In an embodiment, each surgical-instrument cleaning detergent cycle subjects the strain gauge 100 to a substance having a pH level of equal to or greater than 9 pH. In an embodiment, the pH level of the detergent substance is equal to or less than 11 pH. In an embodiment, the first instance is prior to exposure of the strain gauge 100 to a surgical-instrument cleaning detergent cycle, and the second instance is subsequent to exposure of the strain gauge 100 to at least 25 surgical-instrument cleaning detergent cycles, alternatively to at least 50 surgical-instrument cleaning detergent cycles, or further alternatively to at least 100 surgical-instrument cleaning detergent cycles.

To withstand the aforementioned autoclave cycles and/or surgical-instrument cleaning detergent cycles without statistically significant loss in accuracy, not only does the electrical circuit 302 of the electrically conductive strain sensor layer 300 have to be adequately sealed to prevent a corrosion-influenced electrical short circuit path that would otherwise be effective to cause the Bridge 322 to become unbalanced, but also the input and output terminals 304, 306, 308, 310 have to be adequately sealed while permitting solderable contacts to be electrically connected thereto. In an embodiment, a plurality of solderable contacts 324, 326, 328, 330 are disposed on respective ones of the input and output terminals 304, 306, 308, 310 on top of the conductive layer 300, each of the at least two input terminals 304, 306 and the at least two output terminals 308, 310 being in electrical connection with a respective one of the plurality of solderable contacts 324, 326, 328, 330, where the plurality of solderable contacts 324, 326, 328, 330 are physically accessible for a solder connection 114 via respective open regions 404 absent the at least one second dielectric layer 400.

The open regions 404 absent the at least one second dielectric layer 400 may be formed in at least two different ways.

In a first way, the plurality of layers 400, and more specifically the a-layer 400.1, is conformally applied to seal the entire surface of the electrically conductive strain sensor layer 300, including the previously applied solderable contacts 324, 326, 328, 330. Vias (also herein referred to by reference numeral 404) are then etched through the a-layer 400.1 to form the respective open regions 404, thereby providing for the plurality of solderable contacts 324, 326, 328, 330 to be physically accessible via respective vias 404 through the a-layer 400.1 of the plurality of layers 400, the respective vias 404 being the respective open regions 404 absent material of the plurality of layers 400. The b-layer 400.2 is then conformally applied to further seal the underlying materials, including the solder connection 114. FIG. 3 depicts the entire solderable contact 324 disposed completely on the respective terminal 304 of the electrically conductive strain sensor layer 300, and the a-layer 400.1 completely sealing around the perimeter of the solderable contact 324. The other solderable contacts 326, 328, 330 are formed the same way.

Figure 4:
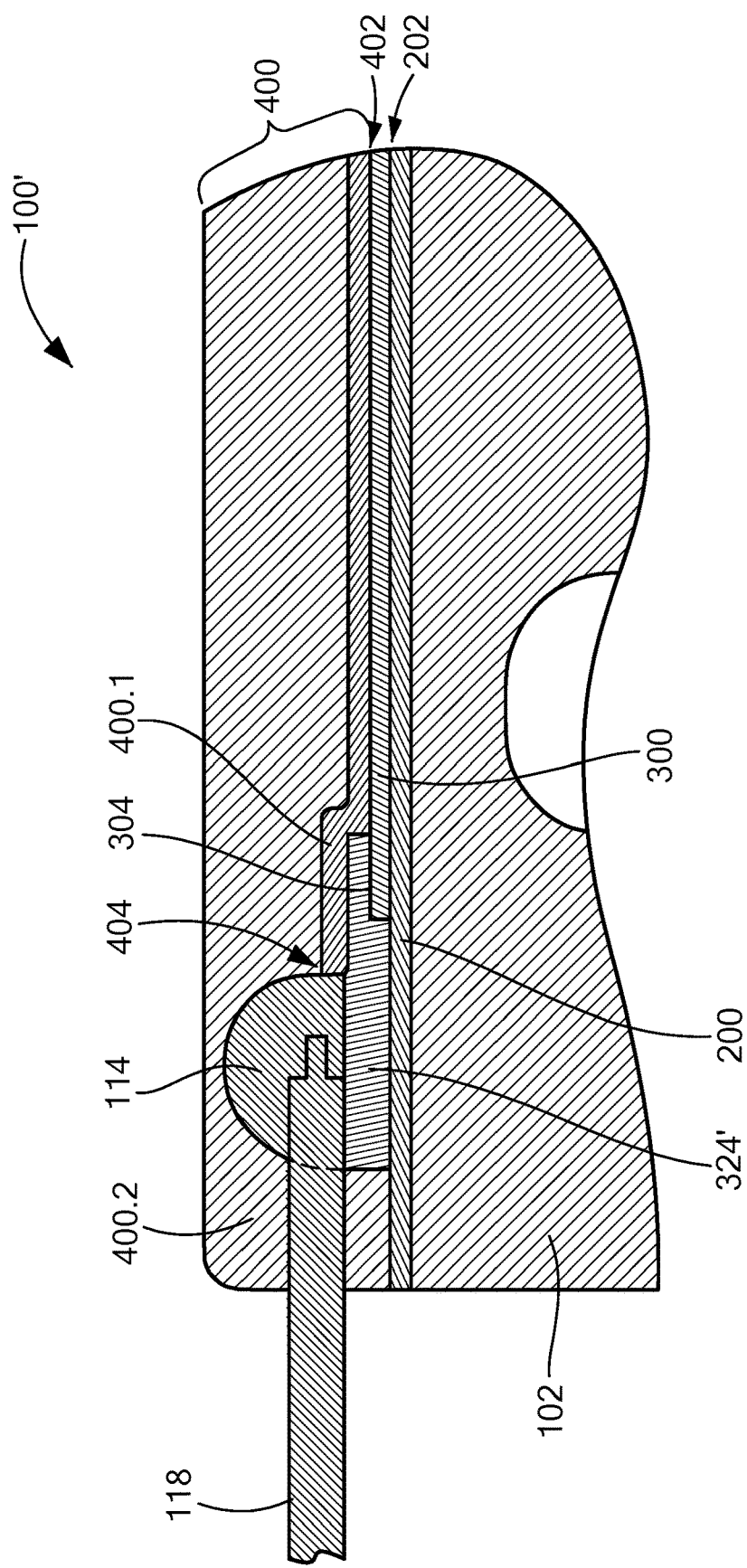
FIG. 4 depicts an alternative section cut similar to that of FIG. 3 in accordance with an embodiment of the invention.

In a second way, and with reference to alternative strain gauge 100' depicted in FIG. 4 where like features are numbered alike, the solderable contact 324' extends beyond an outer perimeter of the electrically conductive strain sensor layer 300, being disposed partially on the respective terminal 304, and partially on the at least one dielectric layer 200. Also depicted in FIG. 4 is the solderable contact 324' being disposed in overlapping relationship with an outer edge of the a-layer 400.1. In this embodiment, accessibility to the solderable contact 324' may be created by masking the radially outer region of the solderable contact 324' prior to conformally applying the a-layer 400.1 of the plurality of layers 400, thereby leaving exposed the open regions 404 upon removal of the mask after the a-layer 400.1 is conformally applied, resulting in the plurality of solderable contacts (contact 324' for example) being physically accessible via the respective open regions 404 disposed proximate an outer edge of the a-layer 400.1. The b-layer 400.2 is then conformally applied to further seal the underlying materials, including the solder connection 114.

A third option for exposing the solderable contacts is to mask the contact region while depositing the encapsulating a-layer 400.1. In this embodiment, accessibility to the solderable contact 324' may be created by placing the mask directly on the substrate 102' prior to conformally applying the a-layer 400.1 of the plurality of layers 400. Removal of the mask would then leave the solderable contacts un-encapsulated thus eliminating the need to etch vias.

While FIG. 3 depicts only one solderable contact 324, it will be appreciated that the other solderable contacts 326, 328, 330 depicted in FIG. 2 are similarly constructed. And while FIG. 4 depicts only one solderable contact 324', it will be appreciated that three other solderable contacts, synonymous to contacts 326, 328, 330, may be similarly constructed.

With respect to either the embodiment depicted in FIG. 3 or the embodiment depicted in FIG. 4, an embodiment further includes respective ones of a plurality of electrical wires 118 electrically connected to respective ones of the plurality of solderable contacts, such as the solderable contacts 324, 324' or any other such solderable contact as described herein for example. The electrical wires 118 may be electrically connected to the solderable contacts via solder 114, or by any other means suitable for a purpose disclose herein, such as ultrasonic welding for example. In an embodiment, the electrical wires 118 are insulated 34 AWG (American Wire Gauge).

Alternative to the use of electrical wires 118, a flex circuit, such as a flexible printed circuit board for example, may be employed. The flex circuit may be soldered or wire bonded to the solderable contacts.

Referring back to FIG. 2, an embodiment of the strain gauge 100 includes an arrangement where the plurality of electrically resistive thin film sensors 320 of the Bridge 322 are arranged relative to each other and to an orthogonal set of X-Y axis such that: a first pair of the sensors 320.1, 320.2 have mirror image symmetry with respect to the X-axis; a second pair, different from the first pair, of sensors 320.3, 320.4 have mirror image symmetry with respect to the X-axis; a third pair, different from the first and the second pair, of sensors 320.1, 320.3 have mirror image symmetry with respect to the Y-axis; and, a fourth pair, different from the first, the second, and the third pair, of sensors 320.2, 320.4 have mirror image symmetry with respect to the Y-axis. Another embodiment of the strain gauge 100 includes an arrangement where the plurality of electrically resistive thin film sensors 320 of the Bridge 322 are further arranged relative to each other and to the orthogonal set of X-Y axis such that: a fifth pair, different from the first, the second, the third, and the fourth pair, of the sensors 320.5, 320.6 have mirror image symmetry with respect to the X-axis; a sixth pair, different from the first, the second, the third, the fourth pair, and the fifth pair, of sensors 320.7, 320.8 have mirror image symmetry with respect to the X-axis; a seventh pair, different from the first, the second, the third, the fourth pair, the fifth, and the sixth pair, of sensors 320.5, 320.7 have mirror image symmetry with respect to the Y-axis; and, an eighth pair, different from the first, the second, the third, the fourth pair, the fifth, the sixth, and the seventh pair, of sensors 320.6, 320.8 have mirror image symmetry with respect to the Y-axis.

With reference to FIGS. 1 and 2 in combination, an embodiment of the strain gauge 100 includes an arrangement where the plurality of electrically resistive thin film sensors 320 of the Bridge 322 are radially disposed with respect to the Z-axis between the engagement surface 106 and an outer body 120 of the substrate 102 in the region 110. In an embodiment, respective pairs of the sensors 320 are diametrically opposed with respect to each other, as depicted in FIG. 1 by sensor pairs: 320.1 and 320.4; 320.2 and 320.3; 320.5 and 320.8; and, 320.6 and 320.7, for example.

While an embodiment of the strain gauge 100 is described and illustrated herein having sensors 320 arranged relative to each other in a particular geometric pattern, it will be appreciated that this is for illustration purposes only and that the scope of the invention is not so limited, as different strain gauge applications may be better served having the sensors 320 arranged relative to each other in a different geometric pattern, such as being oriented in an aligned linear arrangement, oriented in an orthogonal arrangement, or oriented in a radial arrangement, for example. As such, any geometric pattern of sensors 320 suitable for a purpose disclosed herein is considered to fall within the scope of the invention disclosed herein.

Operation of the strain gauge 100 involves the outer body 120 being held fixed relative to the engagement surface 106 while the force F, or more generally the pressure P, is applied to the engagement surface 106, which results in the upper-side 108, and particularly the region 110 where the plurality of electrically resistive thin film sensors 320 of the Bridge 322 are disposed, being subjected to a strain. Flexing of the electrically conductive strain sensor layer 300 causes the Bridge 322 to become unbalanced. Knowing the strain sensitivity of the strain gauge 100, one can determine the applied strain, and force F or pressure P, from the change in gauge resistance using known techniques. If one or more of the plurality of electrically resistive thin film sensors 320 experience a change in resistivity due to one or more corrosion-influenced electrical short circuit paths, which may result from the extreme environment of an autoclave cycle for example, then the applied strain and force F or pressure P will not be able to be accurately determined. As such, it is the role of the at least one dielectric layer 200 and the plurality of layers 400 to provide the necessary bond and moisture seal to protect the electrically conductive strain sensor layer 300 of the Bridge 322 from corrosion, while at the same time being flexible enough to permit the electrically conductive strain sensor layer 300 of the Bridge 322 to flex under the applied strain. While not being held to any particular theory, Applicant has found that sandwiching the electrically conductive strain sensor layer 300 of the Bridge 322 between at least one first bonded oxide layer, with reference to reference numeral 200, and at least one second bonded oxide layer, with reference to reference numeral 400, having structure as disclosed herein, provides the desired protection for the strain gauge 100 to survive multiple autoclave cycles and multiple surgical-instrument cleaning detergent cycles. More particularly, Applicant has found that using an oxide for the at least one dielectric layer 200, and using a combination of silicone on top of an oxide for the b-layer 400.2 and the a-layer 400.1, respectively, provides the desired protection for the strain gauge 100 to survive 25, 50 or even 100 autoclave cycles.

As a result and as disclosed herein, some embodiments of the invention may include some of the following advantages: a strain gauge capable of withstanding the environment of 25, 50 or 100 autoclave cycles without statistically significant loss in accuracy; and, a strain gauge capable of withstanding the environment of 25, 50 or 100 surgical-instrument cleaning detergent cycles without statistically significant loss in accuracy.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An open-face strain gauge, comprising:
a substrate;
at least one dielectric layer disposed on top of the substrate;
a thin film electrical circuit disposed on top of the at least one dielectric layer and having at least two input terminals and at least two output terminals;
a plurality of layers disposed on top of the electrical circuit;
the at least one dielectric layer forming a first moisture resistant seal on one side of the electrical circuit, the plurality of layers forming a second moisture resistant seal on a second side of the electrical circuit opposite the first side, the first and second moisture resistant seals having structure such that:
in a first instance prior to exposure of the strain gauge to an autoclave cycle, the electrical circuit is productive of a first output voltage on the output terminals in response to a first input voltage on the input terminals; and
in a second instance subsequent to exposure of the strain gauge to at least 25 autoclave cycles, the electrical circuit is productive of a second output voltage on the output terminals in response to a second input voltage on the input terminals, the second input voltage being equal to the first input voltage, and the second output voltage being equal to the first output voltage.

2. The strain gauge of claim 1, wherein the second instance is subsequent to exposure of the strain gauge to at least 50 autoclave cycles.

3. The strain gauge of claim 2, wherein the second instance is subsequent to exposure of the strain gauge to at least 100 autoclave cycles.

4. The strain gauge of claim 1, wherein each autoclave cycle is configured to expose the strain gauge to saturated steam at a relative humidity of 100%, at a pressure of 2-35 psi, at a temperature of 100-140 degree-Celsius, for a length of time of 15-20 minutes.

5. The strain gauge of claim 4, wherein the autoclave cycle is configured to expose the strain gauge to saturated steam at a pressure of 16-30 psi, at a temperature of 121-138 degree-Celsius, for a length of time of 17-19 minutes.

6. The strain gauge of claim 1, wherein:
the substrate comprises a corrosion resistant metal;
the at least one dielectric layer is disposed in conforming intimate contact with an upper surface of the substrate;
the electrical circuit comprises a conductive layer having a plurality of electrically resistive thin film sensors electrically arranged to form at least a partial Wheatstone bridge having the at least two input terminals and the at least two output terminals; and
the plurality of layers is disposed in conforming intimate contact with an upper surface of the electrical circuit.

7. The strain gauge of claim 6, further comprising:
a plurality of solderable contacts disposed on top of the conductive layer, each of the at least two input terminals and the at least two output terminals being in electrical connection with a respective one of the plurality of solderable contacts, the plurality of solderable contacts being physically accessible via respective open regions absent material of the plurality of layers.

8. The strain gauge of claim 1, wherein:
the plurality of layers comprises two layers; an a-layer disposed on top of the electrical circuit and a b-layer disposed on top of the a-layer, the a-layer comprising an oxide, and the b-layer comprising a curable organic encapsulant.

9. The strain gauge of claim 8, wherein the a-layer oxide comprises glass, and the b-layer comprises a curable organic encapsulant comprising silicone.

10. The strain gauge of claim 6, wherein the second output voltage being equal to the first output voltage is representative of the plurality of electrically resistive thin film sensors of the at least a partial Wheatstone bridge being free of strain and absent a corrosion influenced electrical short circuit path effective to cause the at least a partial Wheatstone bridge to become unbalanced.

11. The strain gauge of claim 8, wherein the plurality of solderable contacts are physically accessible via respective vias through the a-layer, the respective vias being the respective open regions absent material of the a-layer.

12. The strain gauge of claim 8, wherein the plurality of solderable contacts are physically accessible via the respective open regions disposed proximate an outer edge of the a-layer.

13. The strain gauge of claim 7, further comprising:
respective ones of a plurality of electrical wires electrically connected to respective ones of the plurality of solderable contacts.

14. The strain gauge of claim 13, wherein the electrical wires are electrically connected to the solderable contacts via solder.

15. The strain gauge of claim 1, wherein:
the at least one dielectric layer comprises two layers; a c-layer disposed on top of the substrate and a d-layer disposed on top of the c-layer, the c-layer comprising a native oxide, and the d-layer comprising an oxide.

16. The strain gauge of claim 15, wherein the c-layer native oxide comprises chrome oxide, and the d-layer oxide comprises glass.

17. The strain gauge of claim 1, wherein the substrate comprises a polished upper surface upon which the at least one first dielectric layer is disposed.

18. The strain gauge of claim 6, wherein the conductive layer comprises a resistive alloy, and the electrically resistive thin film sensors of the at least a partial Wheatstone bridge comprise electrical paths defined by etched or laser trimmed portions of the resistive alloy.

19. The strain gauge of claim 1, wherein the thin film electrical circuit is disposed in an open-face relationship with an environment external of the strain gauge.

20. The strain gauge of claim 1, further wherein:
the first instance is prior to exposure of the strain gauge to a surgical-instrument cleaning detergent; and
the second instance is subsequent to exposure of the strain gauge to at least 25 cleaning cycles comprising the surgical-instrument cleaning detergent.

21. The strain gauge of claim 6, wherein:
the plurality of electrically resistive thin film sensors of the at least a partial Wheatstone bridge are arranged relative to each other and to an orthogonal set of X-Y axes such that: a first pair of the sensors have mirror image symmetry with respect to the X-axis; a second pair, different from the first pair, of sensors have mirror image symmetry with respect to the X-axis; a third pair, different from the first and the second pair, of sensors have mirror image symmetry with respect to the Y-axis; and, a fourth pair, different from the first, the second, and the third pair, of sensors have mirror image symmetry with respect to the Y-axis.

22. The strain gauge of claim 21, wherein
the plurality of electrically resistive thin film sensors of the at least a partial Wheatstone bridge are further arranged relative to each other and to the orthogonal set of X-Y axes such that: a fifth pair, different from the first, the second, the third, and the fourth pair, of the sensors have mirror image symmetry with respect to the X-axis; a sixth pair, different from the first, the second, the third, the fourth pair, and the fifth pair, of sensors have mirror image symmetry with respect to the X-axis; a seventh pair, different from the first, the second, the third, the fourth pair, the fifth, and the sixth pair, of sensors have mirror image symmetry with respect to the Y-axis; and, an eighth pair, different from the first, the second, the third, the fourth pair, the fifth, the sixth, and the seventh pair, of sensors have mirror image symmetry with respect to the Y-axis.

23. The strain gauge of claim 6, wherein the substrate further comprises:
an overall circular footprint having a central Z-axis; and
an engagement surface at an underside region of the substrate;
wherein the plurality of electrically resistive thin film sensors of the at least a partial Wheatstone bridge are radially disposed with respect to the Z-axis between the engagement surface and an outer perimeter of the substrate.

* * * * *